US007904266B2

(12) United States Patent
Mendik et al.

(10) Patent No.: US 7,904,266 B2
(45) Date of Patent: Mar. 8, 2011

(54) METHOD AND APPARATUS FOR CALCULATING THE SEPARATION TIME OF ARCING CONTACTS OF A HIGH-VOLUME SWITCHGEAR

(75) Inventors: Michael Mendik, Jeannette, PA (US); Anton Poeltl, Hempfield, PA (US)

(73) Assignee: ABB Technology AG, Zurich (CH)

( * ) Notice: Subject to any disclaimer, the term of this patent is extended or adjusted under 35 U.S.C. 154(b) by 163 days.

(21) Appl. No.: 12/122,860

(22) Filed: May 19, 2008

(65) Prior Publication Data

US 2008/0294353 A1 Nov. 27, 2008

Related U.S. Application Data

(60) Provisional application No. 60/939,412, filed on May 22, 2007.

(51) Int. Cl.
*G01R 29/02* (2006.01)
*H02B 11/00* (2006.01)

(52) U.S. Cl. ................. 702/79; 702/89; 702/176; 361/2; 361/605

(58) Field of Classification Search .................... 702/79, 702/89, 176

See application file for complete search history.

(56) References Cited

U.S. PATENT DOCUMENTS

| | | | | |
|---|---|---|---|---|
| 2,878,402 | A * | 3/1959 | Kohn | 361/8 |
| 4,012,614 | A * | 3/1977 | Dakin et al. | 218/143 |
| 4,977,513 | A * | 12/1990 | LaPalme | 700/293 |
| 5,644,463 | A * | 7/1997 | El-Sharkawi et al. | 361/94 |
| 6,313,636 | B1 * | 11/2001 | Pohl et al. | 324/421 |
| 6,472,877 | B1 * | 10/2002 | Sands | 324/423 |

* cited by examiner

*Primary Examiner* — Drew A Dunn
*Assistant Examiner* — Jonathan C Teixeira Moffat
(74) *Attorney, Agent, or Firm* — GDS Legal Dept.; Michael C. Prewitt; Michael M. Rickin

(57) ABSTRACT

A method and an apparatus for calculating the separation time of the arcing contacts of a high-voltage switchgear which is operatively coupled to a synchronous switching device and to an auxiliary switch having auxiliary contacts operatively connected to the arcing contacts. During execution of a predefined test condition the separation time of the arcing contacts and of the auxiliary contacts is measured. The time delay between the measured separation time of the arcing contacts and of the auxiliary contacts is calculated. Upon separation of the arcing contacts under an operating condition other than the predefined test condition, the separation time of the auxiliary contacts is measured. Then, the separation time of the arcing contacts is calculated as the difference between the separation time of the auxiliary contacts measured during the operating condition other than the predefined test condition and the calculated time delay.

11 Claims, 4 Drawing Sheets

METHOD AND APPARATUS FOR CALCULATING THE SEPARATION TIME OF ARCING CONTACTS OF A HIGH-VOLUME SWITCHGEAR

CROSS REFERENCE TO RELATED APPLICATION

This application claims the priority of U.S. provisional patent application Ser. No. 60/939,412 filed on May 22, 2007, entitled "Method And Apparatus For Calculating the Separation Time of Arcing Contacts of a High-Voltage Switchgear" the contents of which are relied upon and incorporated herein by reference in their entirety, and the benefit of priority under 35 U.S.C. 119(e) is hereby claimed.

BACKGROUND OF THE INVENTION

This invention relates in general to the field of synchronous switching operations in power lines. In particular, the present invention relates to a method and an apparatus for more accurately calculating the time of arcing contacts separation of a high voltage switchgear.

As it is well known, power systems for transmitting and distributing electricity from power sources to various loads and users are equipped with several types of protecting switchgear, such as high-voltage circuit breakers. Such switchgear are typically adapted for intervening under determined operating conditions so as to ensure a proper functioning of an associated power line and of loads/users connected therewith.

Voltage and current transients generated during switching of high-voltage circuit breakers are of increasing concern for the electric utility industry. These concerns include both power quality issues for voltage-sensitive customer loads, and excessive stresses on power system equipment. Some proposed solutions for reducing switching transients include circuit breaker pre-insertion devices, such as resistors or inductors, and fixed devices such as arresters and current limiting reactors.

A solution finding increasing popularity is the so-called synchronous switching method, sometimes also referred to as the point-on-wave switching. Synchronous switching is performed by dedicated electronic devices which—upon receiving a close or a trip command—delay the energization of the circuit breaker control coils by a few milliseconds. In this way, the current inception in the case of a close command, or the contact separation in the case of an opening or trip command, is expected to coincide with a certain point on the AC wave which is known to reduce switching transients. For synchronous closing, this point is often the voltage zero crossing. Applications where it is beneficial to close the contacts on or near the voltage zero crossing include the energizing of capacitor banks and energizing of unloaded lines or cables. Synchronous opening can be employed for shunt reactors de-energizing as an example.

The risk of re-ignitions, which are often accompanied by potentially harmful transients, is greatly reduced by moving the time of arcing contacts separation to a point on the current wave which is from one to two milliseconds after a zero crossing. This ensures that the contacts have at least one half-cycle minus two milliseconds to reach a safe dielectric distance before the occurrence of the next zero crossing.

To ensure that the targeted point on-wave coincides with the separation of the arcing contacts, the opening time of each pole has to be determined very accurately. Various equations and models are employed to calculate changes of the circuit breaker opening time depending on mechanism temperatures, control voltages and other external parameters. Gradual changes of the circuit breaker opening time that are not caused by external parameters can be captured using a method called feedback adaptation. As part of the feedback adaptation, the time difference between the arcing contacts separation and the targeted point-on-wave is used to calculate a so-called adaptation adjustment:

$$t_{adapt.adj.,k+1}=t_{adapt.adj,k}\cdot(1-G)+G\cdot(t_{target}-t_{cont.sep.})$$

where $t_{adapt.adj'k}$ is the adaptation adjustment calculated from the $k^{th}$ synchronous circuit breaker operation, G is a weight factor between 0 and 1.0, $t_{target}$ is the targeted point-on-wave, and $t_{cont.sep}$ is the time of contact separation.

The adaptation adjustment is used to calculate the opening time:

$$t_{opening}=t_{std}-t_{adapt.adj,k}+f(T_{mech}, V_{control}, \ldots)$$

where $t_{opening}$ is the newly calculated opening time, $t_{std}$ is the standard opening time, $T_{mech}$ is the mechanism temperature, $V_{control}$ is the substation control voltage and f is a function yielding the change of the opening time depending on external parameters such as temperature, control voltage etc.

Under high-voltage conditions, the time of arcing contacts separation cannot be determined from the time of the circuit breaker current interruption or any other criteria based on circuit breaker current measurement. This is because the circuit breaker current continues to flow at least until the next zero crossing following the arcing contacts separation. Therefore, the time of opening of auxiliary contacts coupled to the arcing contacts of the circuit breaker is used in lieu of the separation time of the arcing contact.

When using the time of auxiliary contacts opening in lieu of the time of arcing contacts separation, aligning the opening of the auxiliary contacts with the arcing contacts of the circuit breaker is difficult and a time difference of a few milliseconds may remain.

Potential inaccuracies in obtaining correct feedback signals may cause inaccuracies in calculating the circuit breaker opening time, which in turn would cause inaccurate synchronous opening operations.

Therefore, it would be desirable to obtain a more accurate calculation of the separation time of the arcing contacts of a high-voltage switchgear, such as a high-voltage circuit breaker. This solution is provided by the method and apparatus of the present invention.

SUMMARY OF THE INVENTION

In accordance with the present invention, there is provided a method for calculating the separation time of arcing contacts of a high-voltage switchgear which is operatively coupled to a synchronous switching device and to an auxiliary switch, said auxiliary switch having separable auxiliary contacts which are operatively connected to said arcing contacts. The method comprises:

operating said high-voltage switchgear in a testing phase;

executing during said testing phase of said high-voltage switchgear a predefined operating condition of said switchgear;

measuring the separation time of said arcing contacts and the separation time of said auxiliary contacts during execution of a predefined operating condition;

calculating the time delay between the measured separation time of said arcing contacts and the measured separation time of the auxiliary contacts for the executed predefined operating condition;

upon separation of said arcing contacts under an operating condition other than said predefined operating condition, measuring the separation time of the auxiliary contacts for said operating condition other than said predefined operating condition; and calculating the separation time of the arcing contacts as the difference between the separation time of said auxiliary contacts measured during said operating condition other than said predefined operating condition and said calculated time delay.

Also provided in accordance with the present invention is a high-voltage apparatus operatively coupled to an associated power line, comprising:

a high-voltage switchgear comprising arcing contacts which can be switched between a first position where they are coupled and a second position where they are separated;

a switching device which is operatively coupled to said high-voltage switchgear for switching the arcing contacts between said first and second positions substantially synchronously with said power line;

an auxiliary switch comprising separable auxiliary contacts which are operatively connected to said arcing contacts; wherein said switching device comprises a computer device having code therein configured to:

when said high-voltage switchgear is operated in a testing phase, measure the separation time of said arcing contacts and the separation time of the auxiliary contacts during execution of a predefined operating condition;

calculate the time delay between the measured separation time of the arcing contacts and the measured separation time of the auxiliary contacts for the executed predefined operating condition; and measure, upon separation of said arcing contacts under an operating condition other than said predefined operating condition, the separation time of the auxiliary contacts for said operating condition other than said predefined operating condition and calculate the separation time of the arcing contacts as the difference between the separation time of said auxiliary contacts measured during said operating condition other than said predefined operating condition and said calculated time delay.

BRIEF DESCRIPTION OF THE DRAWINGS

The features, aspects, and advantages of the present invention will become better understood with regard to the following description, appended claims, and accompanying drawings where:

DETAILED DESCRIPTION OF ILLUSTRATIVE EMBODIMENTS

Figure 1:
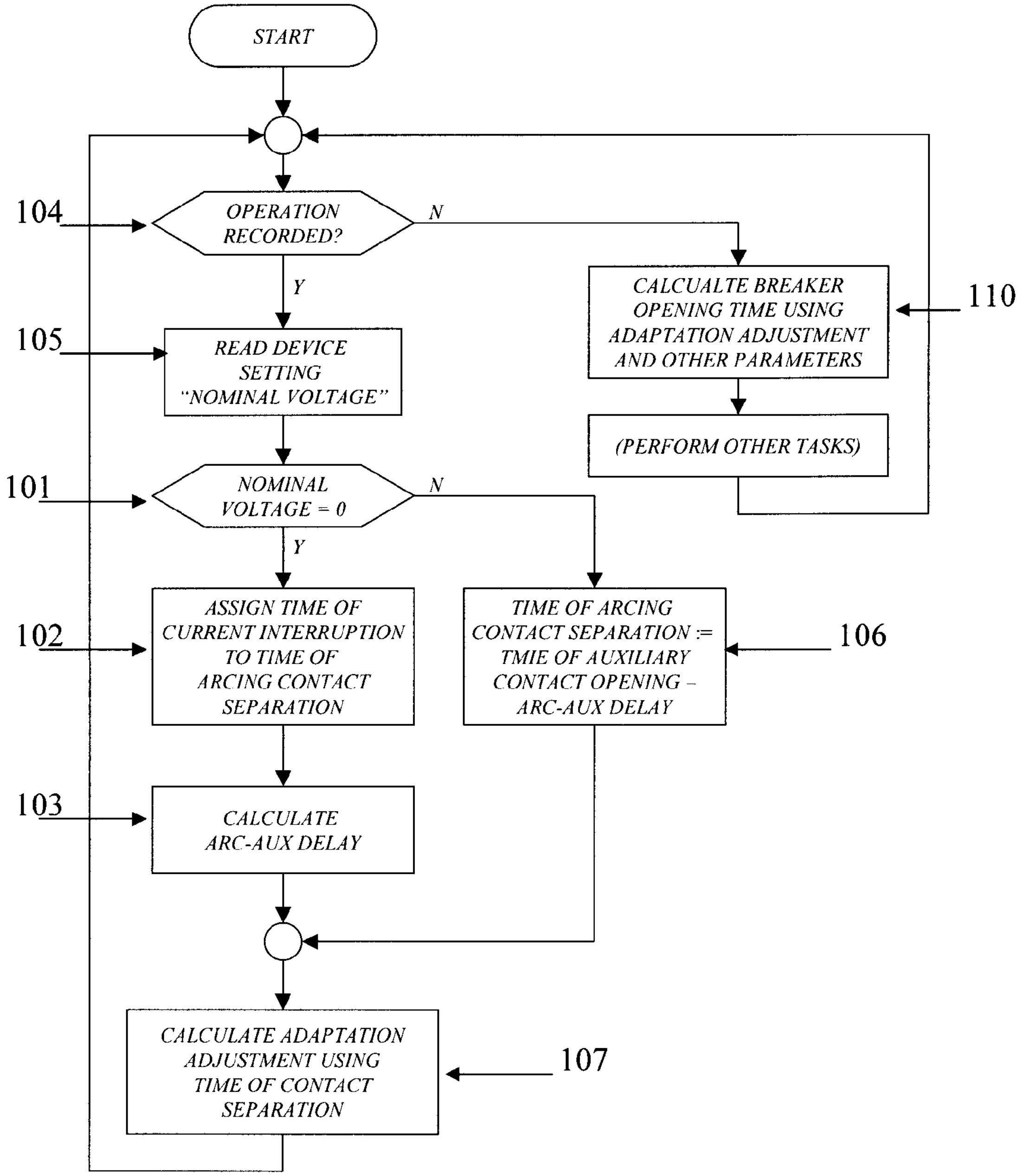
FIG. 1 is a flow chart illustrating a method for calculating the separation time of the arcing contacts of a high-voltage switchgear in accordance to the present invention.

It should be noted that in the detailed description that follows, identical components have the same reference numerals, regardless of whether they are shown in different embodiments of the present invention. It should also be noted that in order to clearly and concisely disclose the present invention, the drawings may not necessarily be to scale and certain features of the invention may be shown in somewhat schematic form.

Figure 4:
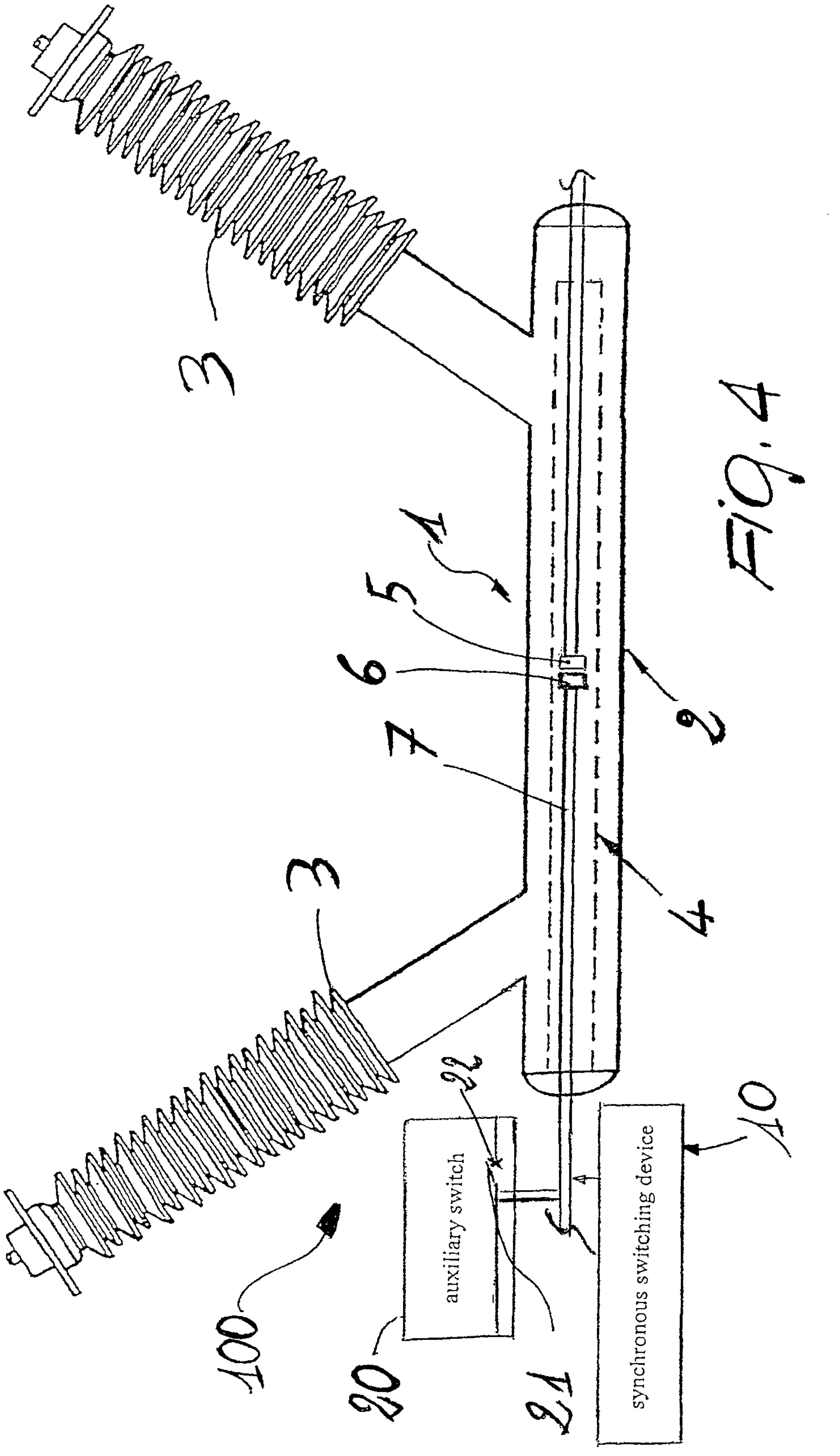
FIG. 4 is a view schematically illustrating a high-voltage apparatus according to the present invention.

FIG. 4 schematically illustrates a high-voltage apparatus according to the present invention which is indicated by the overall reference number 100 and is suitable to be operatively coupled to an associated power line, not shown in the figures. The apparatus 100 comprises a high-voltage switchgear 1 an exemplary embodiment of which is shown in FIG. 4. In the embodiment illustrated, the switchgear 1 comprises a casing 2 which is connected to two bushings 3 each housing an electrical terminal for input/output connections with a power line. Inside the casing 2, there is positioned an interrupter 4 which comprises a pair of separable arcing contacts. The arcing contacts comprise usually a first fixed contact and a movable contact 6. In some types of switchgear also the first contact 5 can be movable.

As well known in the art, during operations of the switchgear, i.e. opening/closing maneuvers, the movable contact 6 is moved by suitable actuating means which comprise for example a trip element, such as an energizing coil (not shown) and an actuating rod 7. Accordingly, the arcing contacts 5-6 are switched between a first position where they are coupled to each other and a second position where they are instead separated. Those skilled in the art would appreciate that other types of high-voltage switchgear other than that illustrated in FIG. 4 can be suitably used.

The switchgear 100 according to the present invention further comprises a synchronous switching device 10 which is operatively coupled to the high-voltage switchgear 1. The switching device 10 is a processor-based electronic device which comprises one or more settings and a dedicated software code stored therein. This software code is adapted to allow outputting command signals to the actuating means so that switching operations of the arcing contacts 5-6 between the first position and the second position are realized substantially synchronously with the AC wave of the associated power line. An example of a suitable synchronous switching device 10 which can be used in the switchgear 1 is the ABB Switching Control Sentinel (SCS), or the ABB Synchronous Control Unit (SCU). However, it would be appreciated by those skilled in the art that any other suitable synchronous switching device available on the market can be used.

As illustrated, the switchgear 100 comprises an auxiliary switch 20 having a pair of auxiliary contacts which are operatively connected to the arcing contacts 5-6. In particular, according to solutions well known in the art and therefore not described herein in detail, the auxiliary contacts comprise a fixed auxiliary contact 21 and a movable auxiliary contact 22 which is operatively connected to and actuated by the actuating means 7 moving the movable arcing contact 6. In practice, when the synchronous switching device 10 outputs for instance an opening command for the switchgear 1, the movement of the arcing contact 6 results also in moving the auxiliary contact 22 so that it separates from the fixed auxiliary contact 21. An example of a suitable auxiliary switch 20 is the auxiliary switch Ruhrtal GPFX730166P001.

In the apparatus and method according to the invention, during a commissioning or test phase, one of the settings of the synchronous switching device 10 is previously assigned with a representative value indicative of a predefined operating condition, i.e. a test condition. For example, a user can set the nominal voltage setting equal to zero. In this way, the user indicates to the device 10 that operations are performed using low-voltage and low-current. "Low-voltage" as used herein means operations with nominal voltage below 1 kV. At step 101 of the flow chart shown in FIG. 1, the value of nominal voltage is checked and the switching device 10 decides whether execution will continue at step 102 or step 106 which will be described hereinafter.

Then, a separation of the arcing contacts 5 and 6 is executed under the predefined operating condition, i.e. the arcing contacts 5-6 are separated under a low voltage condition. The executed predefined operating condition can be for example the so-called light bulb test which, as well known, is a typical part of the commissioning phase of a high-voltage switchgear, in particular a high-voltage circuit breaker controlled by a switching device. While performing a light bulb test, the interrupter (or circuit breaker) 4 is used to switch standard light bulbs (ratings around 120V, 100 W) in order to create AC signals that can be fed into the synchronous switching device 10 for test purposes. The AC signal from the light bulb current provides the synchronous switching device 10 with the information it needs to determine the exact time of the targeted points-on-wave. The synchronous switching device 10 can also extract the time of current interruption from this signal when the circuit breaker operates.

Figure 2:
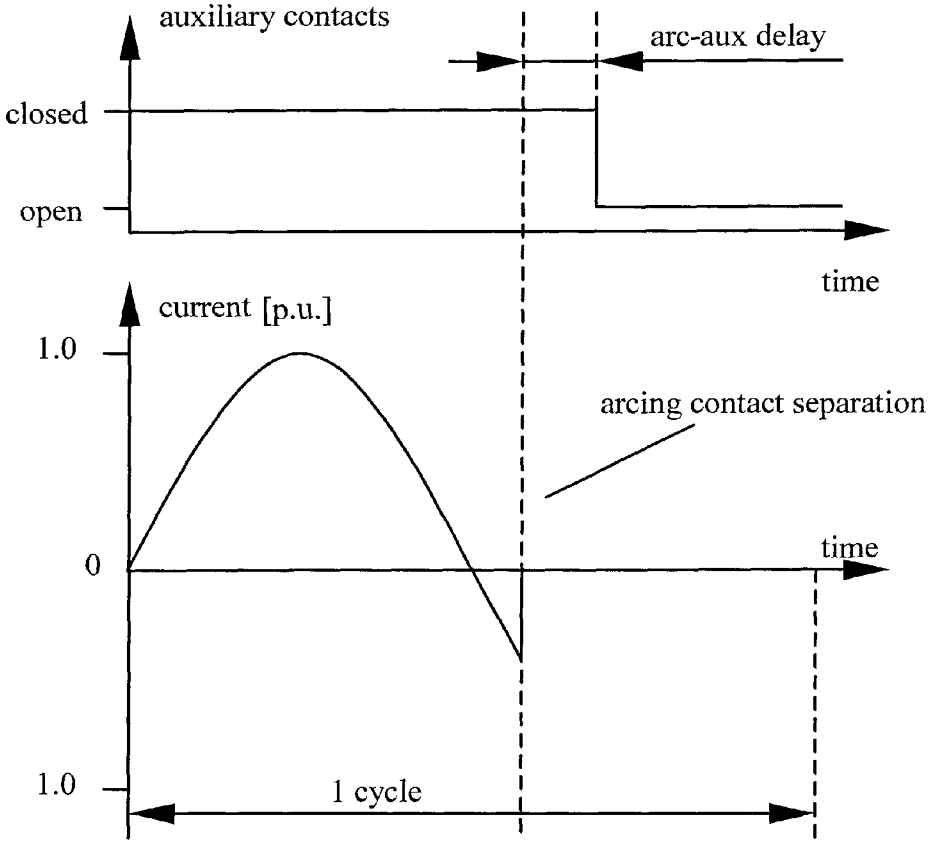
FIG. 2 is a graph schematically representing the trend of the current wave when the arcing contacts of a high-voltage switchgear separate during execution of a predefined test condition under low-voltage.

FIG. 2 shows an example of the current waveform and the signal derived from opening the auxiliary switch contacts 21-22 under low-current and low-voltage conditions. The separation of the arcing contacts 5-6 is clearly marked by the interruption of current. Hence, since the time of current interruption does coincide with the separation time of the arcing contacts 5-6, the time of current interruption is measured for the occurred arcing contacts separation.

At step 102 the measured time of current interruption is assigned equal to the separation time of the arcing contacts 5-6. "Separation time of the arcing contacts" as used herein means the time interval lapsing from the time the synchronous switching device 10 outputs a command signal to the actuating means, e.g. to a trip unit such as an energizing coil, up to when the movable arcing contact 6 is not any more in mechanical contact with the fixed arcing contact 5.

As above indicated, the separation of the arcing contacts causes also the separation of the auxiliary contacts 21-22, and the time of this separation is also measured by the synchronous switching device 10 at step 102. "Separation time of the auxiliary contacts 21-22" as used herein means the time interval lapsing from the time the synchronous switching device 10 outputs a command signal to the actuating means, e.g. a trip unit such as an energizing coil, up to when the movable auxiliary contact 22 is not any more in mechanical contact with the fixed auxiliary contact 21.

At step 103 the synchronous switching device 10 calculates the time delay between the measured separation time of the arcing contacts 5-6 and the measured separation time of the auxiliary contacts 21-22 for the executed predefined operating condition (test condition). After the predefined test condition is performed, the setting previously assigned with the value indicative of the predefined operating condition, e.g. as stated above the assigned nominal voltage equal to zero, can be changed to a different value.

In between recorded operations at step 110 the synchronous switching device 10 keeps the calculated separation times up-to-date taking into account the most recent value of the adaptation adjustments as well as other parameters. Under these conditions, the synchronous switching device 110 has to perform other tasks, including those tasks necessary to perform and record a synchronous switching operation.

When an operation is recorded at step 104, e.g. the switchgear 1 opens and the arcing contacts 5-6 separate, the synchronous switching device 10 reads at step 105 the nominal voltage setting and checks at step 101 if the value assigned to the setting corresponds to the representative value indicative of the predefined operating condition. If the checked value for the setting does not correspond to the representative value of the predefined operating condition, it is determined that separation of the arcing contacts 5-6 occurred under an operating condition other than the predefined operating condition, i.e. the operation was under high-voltage conditions.

Figure 3:
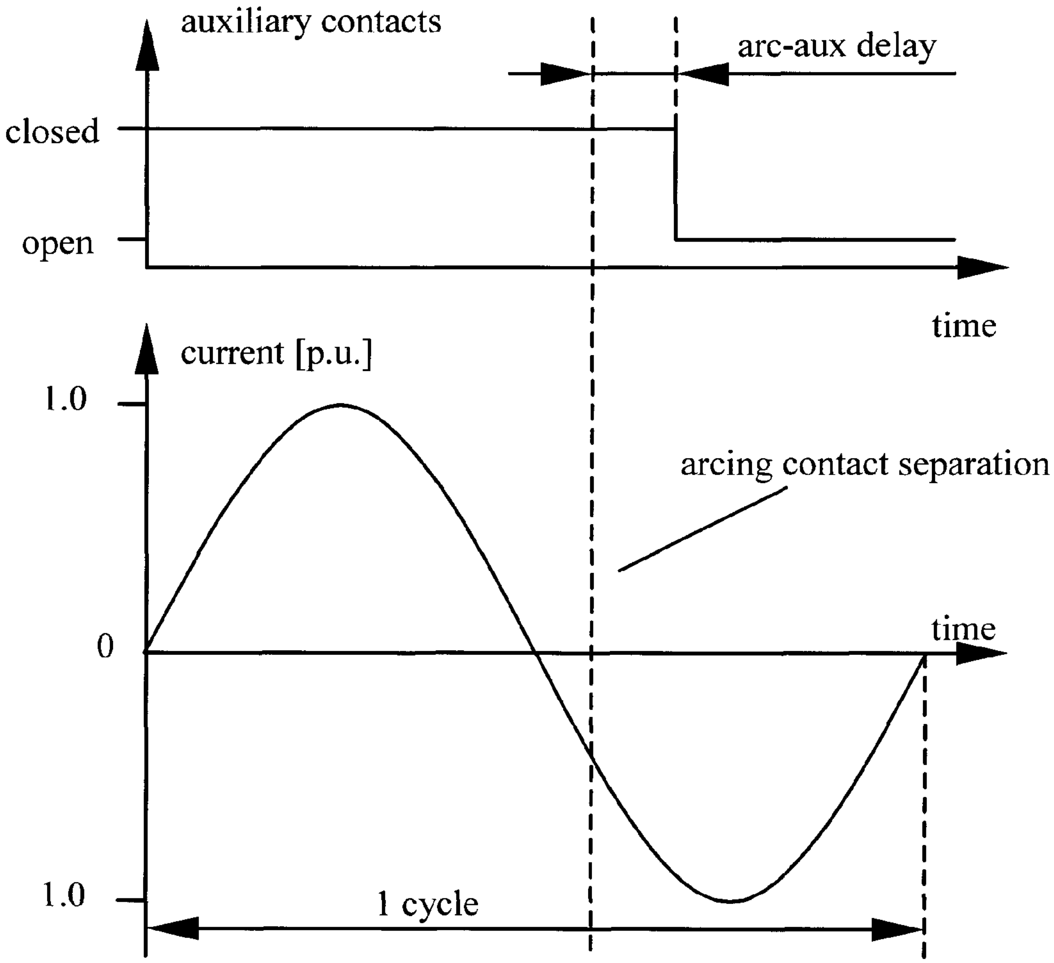
FIG. 3 is a graph schematically representing the trend of the current wave when the arcing contacts of a high-voltage switchgear separate under a high-voltage operating condition.

FIG. 3 shows an example of the same signals illustrated in FIG. 2 but under high-current/high-voltage conditions. Since in this condition following the separation of the arcing contacts the current continues to flow until the next zero crossing, the separation time of the arcing contacts 5-6 cannot be obtained from the current signal. Therefore, in the method according to the invention the synchronous switching device 10 first measures the separation time of the auxiliary contacts 21-22 for the occurred operating condition other than the predefined operating condition, and then calculates at step 106 the separation time of the arcing contacts 5-6 as the difference between the separation time of the auxiliary contacts measured during the operating condition other than the predefined operating condition and the previously calculated time delay at step 103.

If instead for any reason, e.g. further testing, at step 105 the checked value for the setting still corresponds to the representative value of the predefined operating condition, the synchronous switching device 10 determines that the operation was under low-voltage conditions (nominal voltage=0), i.e. a test operation was executed, and therefore, it uses the time of current interrupt as the separation time of arcing contacts and calculates the time delay as above described at steps 102 and 103.

In either way, the newly determined separation time of the arcing contacts is used to calculate the adaptation adjustment. In particular, at step 107 the calculated separation time of the arcing contacts 5-6 is used as an input for the software code of the synchronous switching device 10. By using the newly determined separation time, the synchronous switching device 10 adapts/adjusts its calculations and will issue commands for performing the subsequent operation substantially synchronously with the AC wave of the associated power line.

The separation time of the arcing contacts can be calculated for all phases/poles of the switchgear 1 with more accuracy than according to prior art solutions. This results in an improved target accuracy, i.e. the contact separation actually occurs on the targeted point-on-wave or closer to it than with the prior art solutions. With a better target accuracy, synchronous opening can further reduce the likelihood of re-strikes or re-ignitions, thereby reducing or even eliminating switching transients.

It is to be understood that the description of the foregoing exemplary embodiment(s) is (are) intended to be only illustrative, rather than exhaustive, of the present invention. Those of ordinary skill will be able to make certain additions, deletions, and/or modifications to the embodiment(s) of the disclosed subject matter without departing from the spirit of the invention or its scope, as defined by the appended claims.

What is claimed is:

1. A method for calculating the separation time of arcing contacts of a high-voltage switchgear which is operatively coupled to a synchronous switching device and to an auxiliary switch, said auxiliary switch having separable auxiliary contacts which are operatively connected to said arcing contacts, the method comprising:

operating said high-voltage switchgear in a testing phase;

executing during said testing phase of said high-voltage switchgear a predefined operating condition of said switchgear;

measuring the separation time of said arcing contacts and the separation time of said auxiliary contacts during execution of the predefined operating condition;

calculating the time delay between the measured separation time of said arcing contacts and the measured separation time of the auxiliary contacts for the executed predefined operating condition;

upon separation of said arcing contacts under an operating condition other than said predefined operating condition, measuring the separation time of the auxiliary contacts for said operating condition other than said predefined operating condition; and calculating the separation time of the arcing contacts as the difference between the separation time of said auxiliary contacts measured during said operating condition other than said predefined operating condition and said calculated time delay.

2. The method of claim 1, further comprising:

assigning a representative value indicative of said predefined operating condition to a predetermined setting of said synchronous switching device.

3. The method of claim 2, further comprising:

checking if the value of said predetermined setting of said synchronous switching device arising from an occurred separation of said arcing contacts corresponds to said assigned representative value indicative of said predetermined operating condition.

4. The method of claim 3, wherein, when the checked value for said predetermined setting corresponds to the assigned representative value, said method further comprises:

measuring the time of current interruption for the occurred arcing contacts separation; and assigning the measured time of current interruption equal to the separation time of the arcing contacts.

5. The method of claim 1 wherein execution of said predefined operating condition comprises separating the arcing contacts under a condition wherein said voltage is less than 1 kV.

6. The method of claim 1 further comprising using the calculated separation time of the arcing contacts as an input for said synchronous switching device.

7. A high-voltage apparatus suitable to be operatively coupled to an associated power line, comprising:

a high-voltage switchgear comprising arcing contacts which can be switched between a first position where they are coupled and a second position where they are separated;

a switching device which is operatively coupled to said high-voltage switchgear for switching the arcing contacts between said first and second positions substantially synchronously with said power line;

an auxiliary switch comprising separable auxiliary contacts which are operatively connected to said arcing contacts; wherein said switching device comprises a computer device having code therein configured to:

when said high-voltage switchgear is operated in a testing phase, measure the separation time of said arcing contacts and the separation time of the auxiliary contacts during execution of a predefined operating condition;

calculate the time delay between the measured separation time of the arcing contacts and the measured separation time of the auxiliary contacts for the executed predefined operating condition; and measure, upon separation of said arcing contacts under an operating condition other than said predefined operating condition, the separation time of the auxiliary contacts for said operating condition other than said predefined operating condition and calculate the separation time of the arcing contacts as the difference between the separation time of said auxiliary contacts measured during said operating condition other than said predefined operating condition and said calculated time delay.

8. The high-voltage apparatus of claim 7, wherein said synchronous switching device comprises a predetermined setting assigned with a representative value indicative of said predefined operating condition.

9. The high-voltage apparatus of claim 8, wherein said computer device comprises therein code configured to check if the value of said predetermined setting arising from an occurred separation of said arcing contacts corresponds to the said assigned representative value indicative of said predetermined operating condition.

10. The high-voltage apparatus of claim 9, wherein said computer device comprises therein code configured to measure the time of current interruption for the occurred arcing contacts separation; and assign the measured time of current interruption equal to the separation time of the arcing contacts, when the checked value for said predetermined setting arising from an occurred separation of said arcing contacts corresponds to the assigned representative value indicative of said predetermined operating condition.

11. The high-voltage apparatus of claim 7, wherein said computer device comprises therein code configured to use the calculated separation time of the arcing contacts as an input for adjusting switching of the arcing contacts from said first position to said second position substantially synchronously with said power line.

* * * * *